(12) United States Patent
Allen

(10) Patent No.: US 6,252,772 B1
(45) Date of Patent: Jun. 26, 2001

(54) REMOVABLE HEAT SINK BUMPERS ON A QUAD FLAT PACKAGE

(75) Inventor: Timothy J. Allen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/247,330

(22) Filed: Feb. 10, 1999

(51) Int. Cl.⁷ ................................................. H05H 7/20
(52) U.S. Cl. .............................................................. 361/704
(58) Field of Search ......................... 165/80.2, 80.3, 165/185; 174/163, 52.2, 675; 257/706, 707, 710, 712–713, 718–719, 726–727; 361/704, 707, 710, 717–718, 722, 735, 744, 813

(56) References Cited

U.S. PATENT DOCUMENTS

| | | |
|---|---|---|
| 4,451,973 * | 6/1984 | Tateno et al. ................... 174/52.2 |
| 5,067,006 * | 11/1991 | Marshall et al. ..................... 257/713 |
| 5,367,433 | 11/1994 | Blomquist . |
| 5,615,735 | 4/1997 | Yoshida et al. . |
| 5,660,758 | 8/1997 | McCullough . |
| 5,667,870 | 9/1997 | McCullough . |
| 5,757,075 | 5/1998 | Kitaoka . |
| 5,789,270 | 8/1998 | Jeng et al. . |
| 5,793,613 | 8/1998 | Poinelli et al. . |
| 5,798,570 | 8/1998 | Watanabe et al. . |
| 5,805,430 | 9/1998 | Atwood et al. . |
| 5,807,768 | 9/1998 | Shin . |
| 5,808,359 | 9/1998 | Muto et al. . |
| 5,815,921 | 10/1998 | Burward-Hoy . |
| 5,833,472 | 11/1998 | Bright . |

\* cited by examiner

Primary Examiner—Gregory Thompson
(74) Attorney, Agent, or Firm—Dickstein Shapiro Morin & Oshinsky LLP

(57) ABSTRACT

A heat sink for a quad flat package comprises a heat-radiating plate and a plurality of removable bumpers attached to the plate. An area of reduced thickness is disposed at the junction between each bumper and the plate to facilitate removal of the plurality of bumpers from the plate. Preferably, each bumper includes an alignment feature for engaging a complementary feature formed on one of a mounting substrate and a test fixture.

26 Claims, 2 Drawing Sheets

REMOVABLE HEAT SINK BUMPERS ON A QUAD FLAT PACKAGE

BACKGROUND OF THE INVENTION

1. Field of the Invention

The present invention relates to integrated circuit quad flat packages and particularly to quad flat packages that include a heat sink with bumpers. More particularly, the invention relates to quad flat packages with removable heat sink bumpers.

2. Description of the Related Art

Quad flat integrated circuit packages are known in the art. Moreover, it is known to attach heat sinks with bumpers to the quad flat packages. For example, U.S. Pat. No. 5,808,359 to Muto et al. discloses a quad flat package that includes a heat-radiating metal plate having bumpers formed at the four corners thereof as a unitary structure. Typically, the bumpers on a quad flat package remain with the package to protect the package leads from damage during handling.

Unfortunately, in conventional quad flat packages, the bumpers take up critical space on a circuit board to which the quad flat package is mounted. The space used by the bumpers could be better used by other components or to reduce the size of the board.

SUMMARY OF THE INVENTION

The present invention overcomes the above-recited disadvantage by providing a quad flat package having removable heat sink bumpers. According to the invention, a heat sink for a quad flat package comprises a heat-radiating plate and a plurality of removable bumpers attached to the plate. An area of reduced thickness is disposed at the junction between each bumper and the plate to facilitate removal of the plurality of bumpers from the plate. Preferably, each bumper includes an alignment feature for engaging a complementary feature formed on one of a mounting substrate and a test fixture.

According to one aspect of the invention, the plate is generally square and the plurality of bumpers includes a plurality of bumper hangers and a bumper head coupled to each bumper hanger. The bumper hangers are attached to the plate and extends outwardly from the plate along a diagonal of the plate. The bumper heads include an alignment feature. In a preferred embodiment of the invention, the plurality of bumpers includes four bumpers, with one bumper attached to each corner of the plate and extending outwardly along a diagonal of the plate. The alignment feature preferably includes an aperture formed in each bumper head.

DETAILED DESCRIPTION OF THE DRAWINGS

Figure 1:
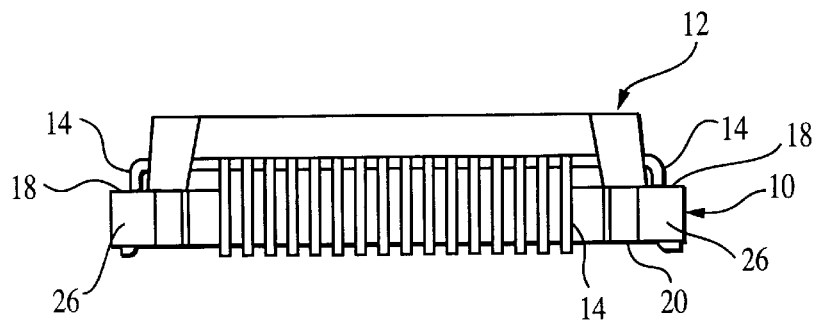
FIG. 1 is a side view of a quad flat package with a heat sink according to the invention.
Figure 2:
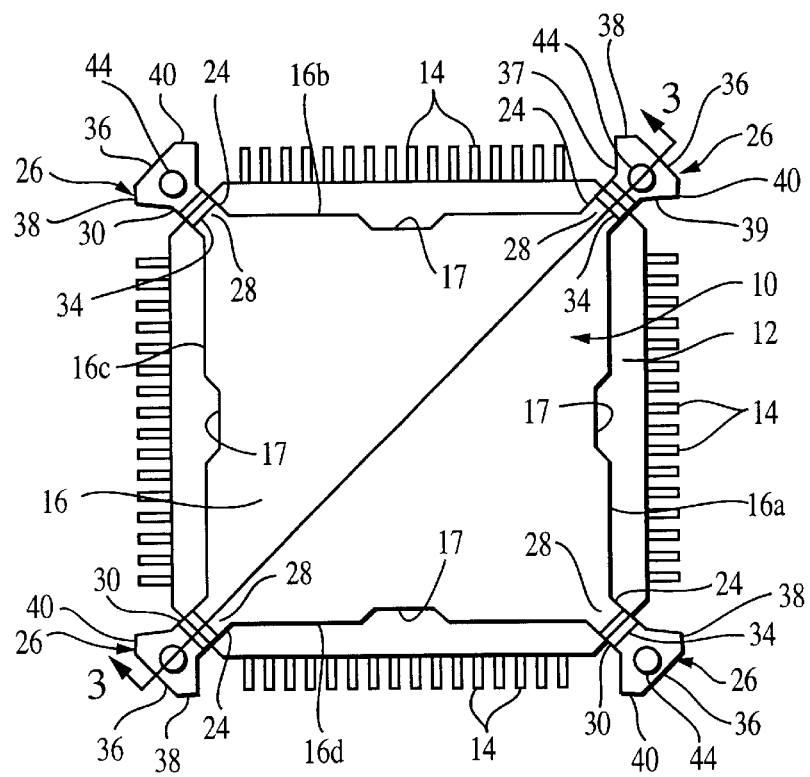
FIG. 2 is a bottom plan view of the quad flat package of FIG. 1.
Figure 3:
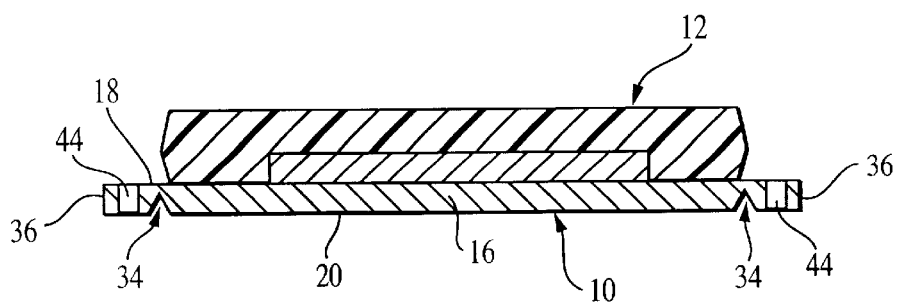
FIG. 3 is a section view taken along lines 3—3 of FIG. 2.

The present invention includes a heat sink 10 attached to a quad flat package 12, as illustrated in FIGS. 1–3. A plurality of leads 14 extend outwardly and downwardly from the quad flat package 12 to connect the package 12 to a circuit board (not shown) or the like.

As best seen in FIG. 2, the heat sink 10 includes a generally square plate 16 defined by sides 16a, 16b, 16c, 16d, a top surface 18 (FIG. 1), a bottom surface 20, a plurality of bumper hangers 24 and a plurality of bumper heads 26. Each side 16a, 16b, 16c, 16d includes a trapezoidal notch 17. Preferably, the heat sink 10 is stamped from a sheet of heat conductive material, but other manufacturing methods and materials can be used.

Each bumper hanger 24 includes a proximal end 28, attached to a corner of the plate 16, and a distal end 30 attached to a bumper head 26. Each bumper hanger 24 advantageously includes a v-shaped notch 34, illustrated in FIGS. 2–3, formed in the bottom surface 20 at the distal end of the bumper hanger 24 and extending partially through the plate 16 toward the top surface 18. The notches 34 allow the bumper heads 26 to be easily removed by bending when the quad flat package 12 is to be installed on a circuit board to provide additional space on the board for other components.

Each bumper head 26 each includes a distal edge 36, oriented perpendicular to the diagonal, side edges 37, 38, 39, 40, and a central aperture 44. Each side edge 38, 40 is oriented parallel to one of the plate sides 16a, 16b, 16c, 16d and lies beyond the farthest extent of the leads 14, as illustrated in FIG. 1. Advantageously, the central apertures 44 can be used to align the heat sink with a mounting structure for a mold cavity during the encapsulation process and/or with a test fixture for testing the completed quad package.

Figure 4:
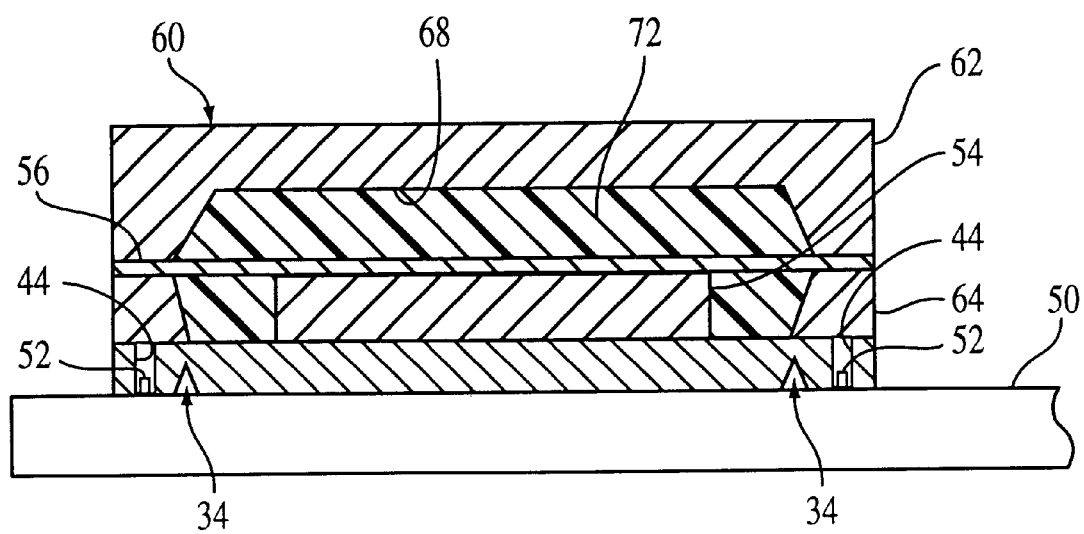
FIG. 4 is a section view taken through a mold for encapsulating a semiconductor circuit on a heat sink to form the quad flat package of FIGS. 1–2.

As illustrated in FIG. 4, during fabrication of the quad flat package the heat sink 10 is disposed on a mounting substrate 50. Preferably, a plurality of alignment pins 52 are formed on the substrate 50 and positioned to engage the apertures 44 to accurately position the heat sink 10 with respect to the substrate 50. A semiconductor device 54, with a lead frame 56 attached, is positioned in thermal contact with the heat sink 10, and a mold fixture 60, including upper and lower mold halves 62, 64 that define a mold cavity 68, is positioned to locate the semiconductor device 54 and portions of the lead frame 56 in the mold cavity 68. Encapsulant material 72 is introduced into the mold cavity 68 to encapsulate the semiconductor device 54 and portions of the lead frame 56 to form a quad flat package 12. After the quad flat package 12 is encapsulated, the upper and lower mold halves 62, 64 are removed and the quad flat package 12 is moved to a test fixture (not shown). Again, pins can be formed on the test fixture to engage the apertures 44 to align the quad flat package 12 with the test fixture. After the testing is completed, the bumper heads 26 can be broken off from the heat sink 10 by bending them at the v-shaped notch 34, and the quad flat package 12 is installed on a circuit board (not shown).

The present invention provides an improved quad flat package that takes up less space on a circuit board and has alignment features to facilitate aligning the package with a mounting substrate and/or a test fixture. Modifications can be made to the invention and equivalents substituted for described and illustrated structures without departing from the spirit or scope of the invention. Accordingly, the scope of the present invention is not to be considered as limited by the specifics of the particular structure which have been described and illustrated, but is only limited by the scope of the appended claims.

What is claimed as new and desired to be protected by Letters Patent of the United States is:

1. A heat sink for a semiconductor package comprising:
   a heat-radiating plate; and
   at least one bumper attached to said plate, said at least one bumper comprising an area of reduced thickness to facilitate removal of said at least one bumper from said plate at said area of reduced thickness.

2. The heat sink of claim 1, wherein said at least one bumper includes an alignment feature for engaging a complementary feature formed on a mounting structure.

3. The heat sink of claim 1, wherein
   said at least one bumper comprises a bumper hanger extending from said plate and a bumper head coupled to said bumper hanger, said bumper head including an alignment feature, and said bumper hanger including said area of reduced thickness to facilitate removal of said bumper head from said bumper hanger.

4. The heat sink of claim 3 wherein said at least one bumper is attached to a corner of said plate and extends outwardly along a diagonal of said plate.

5. A heat sink for a semiconductor package comprising:
   a heat-radiating plate; and
   a plurality of bumpers extending from said plate, each bumper including an alignment feature for engaging a complementary alignment feature formed on a mounting structure, said plurality of bumpers each comprising an area of reduced thickness to facilitate removal of said bumpers from said plate at said areas of reduced thickness.

6. The heat sink of claim 5 wherein each alignment feature includes an aperture for engaging an alignment pin formed on said mounting device.

7. The heat sink of claim 5 further comprising an encapsulating material covering at least a part of a surface of said plate and wherein at least a portion of an opposing surface of said plate is not covered by said encapsulating material and wherein at least some area of said plurality of bumpers extends past said encapsulating material, said plurality of bumpers each comprising an area of reduced thickness to facilitate removal of said bumpers from said plate at said area of reduced thickness.

8. The heat sink of claim 7 wherein said encapsulating material covers a first surface of said plate and extends to about the edges of said plate to form an encapsulating layer and said plurality of bumpers each comprise a bumper hanger extending outwardly from a corner of said plate and a bumper head attached to said bumper hanger, said areas of reduced thickness being located at about the boundary between a said bumper head and a said bumper hanger.

9. A integrated circuit package comprising:
   an integrated circuit;
   a heat sink thermally coupled with said integrated circuit, the heat sink comprising a plate and a plurality of bumpers extending from said plate, each bumper including an area of reduced thickness to facilitate removal of each said bumper from said plate at said area of reduced thickness; and
   an encapsulating layer covering said integrated circuit and bonding it to a portion of said heat sink which does not include an area of each bumper beyond said area of reduced thickness.

10. The integrated circuit package of claim 9, wherein the plurality of bumpers include a plurality of respective alignment features for engaging complementary alignment features formed on a mounting structure.

11. The integrated circuit package of claim 10, wherein the plurality of alignment features includes an aperture formed in each bumper.

12. The integrated circuit package of claim 9 wherein the plate is generally square and the package includes a generally square encapsulating member, the plate further including a plurality of corners and each bumper including a bumper hanger and a bumper head, one bumper hanger extending outwardly from each corner of the plate to a corresponding corner of the encapsulating member, the area of reduced thickness being located at the corner of the encapsulating member.

13. A method for forming a semiconductor package comprising the steps of:
   forming a heat sink having a plate portion and a plurality of bumpers, said bumpers extending from said plate portion and said bumpers each comprising an area of reduced thickness to facilitate removal of said bumpers from said plate at said areas of reduced thickness, the plate portion being configured to receive an encapsulation layer;
   thermal coupling an integrated circuit with said heat sink; and
   encapsulating said integrated circuit with an encapsulating material such that said encapsulating material is in contact with a portion of said heat sink which does not include any part of said bumpers which extend beyond said reduced thickness areas and does not cover an opposing surface of said heat sink.

14. The method of claim 13 wherein the step of forming a heat sink includes the step of forming an alignment feature in each bumper.

15. The method of claim 14 wherein the alignment feature includes an aperture for receiving an alignment pin.

16. A method for forming a semiconductor package comprising the steps of:
   forming a heat sink having a plate portion and a plurality of bumpers extending from said plate portion, wherein each of said bumpers comprises an area of reduced thickness to facilitate removal of said bumpers from said plate at said areas of reduced thickness;
   encapsulating a semiconductor die; and
   securing the encapsulated die to said heat sink.

17. The method of claim 16 wherein each of said bumpers comprise a bumper hanger attached to said plate and a bumper head coupled to said bumper hanger.

18. The method of claim 17 further comprising the step of forming an aperture in said bumper head.

19. The method of claim 16 wherein the encapsulation of said semiconductor die secures said encapsulated die to said heat sink.

20. The heat sink of claim 3 wherein said alignment feature includes an aperture.

21. The method of claim 16 further comprising removing said plurality of bumpers from said plate after said semiconductor die is encapsulated.

22. The method of claim 18 further comprising detaching each of said bumper heads from said plate at said areas of reduced thickness of said bumpers.

23. The heat sink of claim 3 wherein the plurality of bumpers comprises four bumpers.

24. The heat sink of claim 3 wherein the plurality of bumpers includes four bumpers and wherein each one of said bumpers is attached to a respective corner of said plate and extends outwardly from said respective corner.

25. The heat sink of claim 23 wherein said alignment feature includes an aperture.

26. The heat sink of claim 7 wherein each bumper includes a bumper hanger extending outwardly from said plate and a bumper head attached to said bumper hanger, said area of reduced thickness being located at approximately the junction between said bumper head and said bumper hanger.

* * * * *